United States Patent
Ehrenpfordt et al.

(10) Patent No.: US 9,917,213 B2
(45) Date of Patent: Mar. 13, 2018

(54) PHOTOVOLTAIC MODULE AND METHOD FOR PRODUCING A PHOTOVOLTAIC MODULE

(71) Applicant: Robert Bosch GmbH, Stuttgart (DE)

(72) Inventors: Ricardo Ehrenpfordt, Korntal-Muenchingen (DE); Mathias Bruendel, Stuttgart (DE); Frederik Ante, Stuttgart (DE); Johannes Kenntner, Magstadt (DE)

(73) Assignee: Robert Bosch GmbH, Stuttgart (DE)

( * ) Notice: Subject to any disclaimer, the term of this patent is extended or adjusted under 35 U.S.C. 154(b) by 0 days.

(21) Appl. No.: 14/777,413

(22) PCT Filed: Mar. 13, 2014

(86) PCT No.: PCT/EP2014/054924
§ 371 (c)(1),
(2) Date: Sep. 15, 2015

(87) PCT Pub. No.: WO2014/146962
PCT Pub. Date: Sep. 25, 2014

(65) Prior Publication Data
US 2016/0035909 A1 Feb. 4, 2016

(30) Foreign Application Priority Data
Mar. 19, 2013 (DE) .................. 10 2013 204 814

(51) Int. Cl.
*H02N 6/00* (2006.01)
*H01L 31/042* (2014.01)
(Continued)

(52) U.S. Cl.
CPC ...... *H01L 31/02008* (2013.01); *H01L 31/048* (2013.01); *H02S 40/34* (2014.12);
(Continued)

(58) Field of Classification Search
CPC . H01L 2224/48137; H01L 2924/19107; H01L 2924/1461
See application file for complete search history.

(56) References Cited

U.S. PATENT DOCUMENTS 6,342,670 B1 * 1/2002 Lin .................. G08C 23/04
136/244
2010/0116325 A1 5/2010 Nikoonahad
(Continued)

FOREIGN PATENT DOCUMENTS

CN 101425546 A 5/2009
DE 102 39 845 C1 12/2003
(Continued)

OTHER PUBLICATIONS

English machine translation of DE 102008055475 A1, accessed 2016.*
(Continued)

*Primary Examiner* — Angelo Trivisonno
(74) *Attorney, Agent, or Firm* — Maginot, Moore & Beck LLP (57) ABSTRACT

A photovoltaic module has at least one solar cell having an irradiation surface for receiving light. The photovoltaic module is configured to provide a voltage. The photovoltaic module also includes a carrier unit which is arranged laterally offset from the solar cell at least on one side. A first surface of the carrier unit is oriented flush with the irradiation surface of the solar cell within a predefined tolerance range. The photovoltaic module also includes at least one electrical conductor, which contacts a carrier contact connection on a second surface of the carrier unit opposite the first surface via a cell contact connection of an electronic component on the solar cell or the solar cell in an electrically conductive manner. The cell contact connection is arranged on a contacting side of the solar cell opposite the irradiation surface.

18 Claims, 7 Drawing Sheets

(51) Int. Cl.
*H01L 31/02* (2006.01)
*H01L 31/048* (2014.01)
*H02S 40/34* (2014.01)

(52) U.S. Cl.
CPC ............... *H01L 2224/48091* (2013.01); *H01L 2224/48137* (2013.01); *H01L 2924/1461* (2013.01); *H01L 2924/19107* (2013.01); *Y02E 10/50* (2013.01)

(56) References Cited

U.S. PATENT DOCUMENTS

| | | |
|---|---|---|
| 2011/0169554 A1 | 7/2011 | Keysar et al. |
| 2012/0167955 A1* | 7/2012 | Davis .................. H01L 31/049 136/251 |
| 2013/0213473 A1* | 8/2013 | Lee .................. H01L 31/02008 136/259 |

FOREIGN PATENT DOCUMENTS

| | | | | |
|---|---|---|---|---|
| DE | 10 2008 055 475 A1 | | 6/2010 | |
| DE | 102008055475 | * | 6/2010 | ............. H01L 31/05 |

OTHER PUBLICATIONS

International Search Report corresponding to PCT Application No. PCT/EP20141054924, dated Jun. 6, 2014 (German and English language document) (5 pages).

\* cited by examiner

PHOTOVOLTAIC MODULE AND METHOD FOR PRODUCING A PHOTOVOLTAIC MODULE

This application is a 35 U.S.C. § 371 National Stage Application of PCT/EP2014/054924, filed on Mar. 13, 2014, which claims the benefit of priority to Serial No. DE 10 2013 204 814.9, filed on Mar. 19, 2013 in Germany, the disclosures of which are incorporated herein by reference in their entireties.

BACKGROUND

The present disclosure relates to a photovoltaic module, to a method for producing a photovoltaic module, and to a device for producing a photovoltaic module.

The integration of energy converters is currently a trend in the field of electronic packagings. Solar cells especially are used alongside thermoelectric converters for obtaining electrical energy, e.g. for operating sensor modules.

In recent years the use of thin silicon substrates has furthermore become established in construction and connection technology. Said substrates afford advantages in the thermomechanical behavior, inter alia, and can be provided with through contacts and conductor tracks in a very fine pitch. Furthermore, methods for large-area encapsulation of semiconductor components are available as a result of the improvement in molding technology. In "compression molding", areas having a diameter of 300 mm can be covered with polymeric encapsulation materials without any problems.

In principle, two ways of making contact with solar cells are possible. With regard to the cells produced the most often at the present time, contact has to be made with them from the front side and the back side, in order to establish an electrical contact (recognizable from the silver conductor structures on the front side). There are also approaches for making contact purely at the back side; these approaches are still used relatively infrequently at present. US 2011/0169554 A1 discloses an integrated solar-operated appliance.

SUMMARY

Against this background, the present disclosure presents a photovoltaic module, furthermore a method for producing a photovoltaic module and a device for producing a photovoltaic module. Advantageous embodiments are evident from the following description.

The approach presented here provides a photovoltaic module comprising the following features:
  at least one solar cell which has a main irradiation surface (135) for receiving light, intended for providing a voltage;
  a carrier unit which is arranged in a manner laterally offset with respect to the solar cell at least on a first side, wherein a first surface of the carrier unit is aligned flush with the irradiation surface of the solar cell within a predefined tolerance range; and
  at least one electrical conductor which makes electrically conductive contact between a carrier contact connection at a second surface of the carrier unit, said second surface being situated opposite the first surface and a cell contact connection of an electronic component on the solar cell or the solar cell, wherein the cell contact connection is arranged on a contacting side of the solar cell, said contacting side being situated opposite the irradiation surface.

The approach presented here further provides a method, for producing a photovoltaic module, wherein the photovoltaic module comprises at least one solar cell which has a main irradiation surface (135) for receiving light, intended for providing a voltage, wherein the photovoltaic module comprises a carrier unit which is arranged in a manner laterally offset with respect to the solar cell at least on a first side, wherein a first surface of the carrier unit is aligned flush with the irradiation surface of the solar cell within a predefined tolerance range, and wherein the photovoltaic module comprises at least one electrical conductor which makes electrically conductive contact between a carrier contact connection at a second surface of the carrier unit, said second surface being situated opposite the first surface, and a cell contact connection of an electronic component on the solar cell or the solar cell, wherein the cell contact connection is arranged on a contacting side of the solar cell, said contacting side being situated opposite the irradiation surface wherein the method comprises the following steps:
  providing the carrier unit and the solar cell;
  arranging the solar cell in relation to the carrier unit in such a way that the carrier unit is arranged in a manner laterally offset with respect to the solar cell at least on a first side, and wherein the first surface of the carrier unit is aligned flush with the irradiation surface of the solar cell within the predefined tolerance range; and
  electrically conductively connecting the cell contact connection to the carrier contact connection in order to produce the photovoltaic module.

The approach presented here also provides a device for producing a photovoltaic module, wherein the device comprises units designed to carry out the steps of a method in accordance with a variant presented here.

The present disclosure thus provides a device which is designed to carry out or implement the steps of a variant of a method presented here in corresponding equipment. The problem addressed by the disclosure can be solved rapidly and efficiently also by means of this embodiment variant of the disclosure in the form of a device.

In the present case, a device can be understood to be an electrical appliance which processes sensor signals and outputs control and/or data signals in a manner dependent thereon. The device can have an interface that can be embodied in terms of hardware and/or software. In the case of a hardware embodiment, the interfaces can be for example part of a so-called system ASIC that includes a wide variety of functions of the device. However, it is also possible for the interfaces to be dedicated integrated circuits or to consist at least partly of discrete components. In the case of a software embodiment, the interfaces can be software modules that are present for example on a microcontroller alongside other software modules.

In the present case, a solar cell or photovoltaic cell should be understood to be an electronic component which can convert light, in particular sunlight e.g. in the wavelength range of 200 to 1200 nm, into electrical energy. A main irradiation surface (135) should be understood to be a main surface of the solar cell via which the light is incident in the solar cell in order to be converted into electrical energy at a converter layer. A carrier unit should be understood to be, for example, a plate or a rigid element having electrical conductor tracks designed for making electrical contact with structures or electronic components on or at the solar cell. By way of example, the carrier unit can be a printed circuit board designed for accommodating the solar cell. In this case, the carrier unit can be arranged in a manner laterally offset with respect to the solar cell in relation to a direction of light incidence on the main irradiation surface (135), such that a lateral edge of the solar cell is arranged adjacent to or opposite an edge of the carrier unit. The first surface of the carrier unit is aligned flush with the irradiation surface of the solar cell within a predefined tolerance range. Flush alignment of the first surface of the carrier unit within a predefined tolerance range in relation to the irradiation surface can be understood to be alignment which expediently exhibits no step in a transition from the irradiation surface to the first surface but maximally exhibits a step between the first surface of the carrier unit and the irradiation surface, the height of which is not greater than for example 10 percent of the thickness of the carrier unit and/or the thickness of the solar cell. An electrical conductor can be understood to be an electrically conductive connection such as a bonding wire, for example, in order to communicate the electrical energy obtained from the light to the carrier contact connection or a measuring device signal of a physical quantity or a signal derived therefrom to the carrier contact connection.

The approach presented here is based on the insight that a photovoltaic modules can be produced technically very simply and cost-effectively if the solar cell together with the carrier unit are aligned and connected in such a way that the first surface of the carrier unit is aligned flush with the irradiation surfaces of the solar cell within the predefined tolerance range. This affords the possibility of aligning and fixing individual or a plurality of solar cells, produced as a separate electronic component, directly adjacent to a carrier unit. By way of example, the solar cell can be inserted into a cutout or opening of the carrier unit, for example of a printed circuit board, and by means of a simple and cost-effective wiring process. In this way, the photovoltaic module comprising, besides the solar cells as electronic (semiconductor) component, a carrier unit for mounting and for making electrical contact with the solar cell can be produced technically very simply and cost-effectively.

A particularly advantageous embodiment of the present disclosure is one in which the carrier unit laterally surrounds the solar cell on at least two sides, in particular wherein the carrier unit encloses the solar cell in a ring-shaped fashion. Such an embodiment of the present disclosure affords the advantage of particularly secure mounting of the solar cell, wherein particularly high protection of the solar cell can simultaneously be realized by virtue of the embedding of the solar cell into the carrier unit.

In accordance with a further embodiment of the present disclosure, provision can be made of an encapsulation compound which encloses at least the conductor and/or covers or caps the second surface of the carrier unit and/or the contacting side of the solar cell. An encapsulation compound can be understood to be a material which shielded at least part of the conductor, of the second surface of the carrier unit and/or of the contacting side of the solar cell from environmental influences the encapsulation compound can be produced for example in a production step of potting with a potting compound. At the same time, a desired surface shape or structure can be realized by means of the shaping of the encapsulation compound in order at least partly to provide a housing for the photovoltaic module.

A particularly advantageous embodiment of the present disclosure is one in which the encapsulation compound is arranged in at least one region between the solar cell and the carrier unit and thereby separates the solar cell from the carrier unit, in particular wherein the solar cell is laterally completely surrounded by the encapsulation compound. Such an embodiment of the present disclosure affords the advantage of particularly secure fixing of the solar cell to the carrier unit.

In order to cause as little damage as possible, if the photovoltaic module is used further for installation, in accordance with one expedient embodiment of the present disclosure, the encapsulation compound can form an encapsulation compound surface which is aligned flush with the irradiation surface and the first surface. In this way, it is possible to achieve a planar surface on a side of the photovoltaic module which extends from the first surface of the carrier unit via the encapsulation compound surface to the irradiation surface.

In order to safeguard against corrosion or other damage of components of the photovoltaic module, in accordance with one particularly expedient embodiment of the present disclosure, the encapsulation compound can form a fluid-tight seal of a region between the second surface of the carrier unit, the conductor and the contacting surface.

In accordance with a further embodiment of the present disclosure, the carrier unit can be formed by a printed circuit board having a plurality of conductor tracks for connecting different electronic components, in particular wherein at least one of the conductor tracks comprises or forms the carrier contact connection. Such an embodiment of the present disclosure affords the advantage that the carrier unit can be used both for protecting the solar cell and for making electrical contact with the solar cell. A compact and space-saving design of the photovoltaic module can thus be achieved by virtue of this multiple function of the carrier unit.

In order to ensure particularly flexible further contacting of the photovoltaic module, in accordance with a fruther embodiment of the present disclosure, the carrier unit can have at least one through contact which makes electrically conductive contact between the carrier contact connection on the second surface of the carrier unit and at least one further contact connection on the first surface. Such an embodiment of the present disclosure affords the advantage that the photovoltaic module is itself electrically contacted from an arbitrary side, as result of which the possibility for use of the photovoltaic module embodied in this way is significantly increased.

A particularly advantageous embodiment of the present disclosure is one in which the solar cell furthermore has an electronic component designed to measure a physical quantity and/or to process an electrical signal, in particular wherein the electronic component is arranged at the contacting side of the solar cell. Such an embodiment of the present disclosure affords the advantage that the photovoltaic module already provides a further functionality such as, for example, the measurement of the physical quantity and the processing of an electrical signal, wherein in particular this further functionality is fed from electrical energy of the solar cells.

What is also advantageous is a computer program product comprising program code which can be stored on a machine-readable carrier such as a semiconductor memory, a hard disk storage medium or an optical storage medium and is used for carrying out the method according to one of the above-described embodiments if the program product is executed on a computer or a device.

BRIEF DESCRIPTION OF THE DRAWINGS

The disclosure is explained in greater detail by way of example below with reference to the accompany drawings, in which.

DETAILED DESCRIPTION

In the following description of expedient exemplary embodiments of the present disclosure, identical or similar reference signs are used for the similarly acting elements illustrated in the various figures, a repeated description of these elements being dispensed with.

Figure 1:
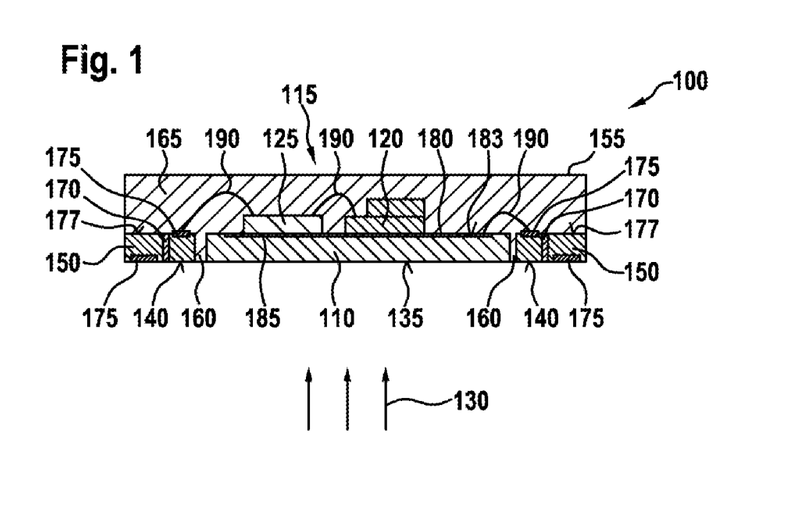
FIG. 1 shows a photovoltaic module in accordance with one exemplary embodiment of the present disclosure.

FIG. 1 shows a photovoltaic module 100 in accordance with one exemplary embodiment of the present disclosure. In this case, the construction concept of the photovoltaic module in one exemplary variant of the disclosure is represented in a sectional illustration. The photovoltaic module 100 comprises a solar cell 110 (which can also be designated as a photovoltaic cell or PV cell), wherein said solar cell 110 integrated for example an in a sensor system 115 comprising for example a microelectronic mechanical sensor (MEMS) 120 and/or an ASIC evaluation circuit 125 in such a way that a solar-active side 135 (which can also be designated as an irradiation side) of the PV cell 110, said solar-active side facing the incident light, together with the underside 140 (also designated hereinafter as first surface) of a redistribution region (interposer) arranged alongside the solar cell 110 as carrier unit 150 forms a lower housing termination of a housing 155 accommodating the photovoltaic module 100. In this case, the first surface 140 of the carrier unit 150 is aligned at a common height level with the irradiation surface 135 of the solar cell 110. In this case, a common height level can be considered to be, for example, an arrangement of the first surface 140 in relation to the irradiation surface 135 in which a step of a transition between the irradiation surface 135 and the first surface 140 is as small as possible or not present at all, but is at most 10 percent of a thickness of the carrier unit 155 or of the solar cell 110.

The carrier unit 155 can be designated as an "interposer" in the present case, wherein in this case carrier unit 155 is taken to mean a region or a component which converts the "fine-pitch" contacts of silicon chips, inter alia, into the "coarser" pitch of the printed circuit board contacts. In the embodiment shown in FIG. 1, the interposer, i.e. the carrier unit 150, extends in a ring-shaped fashion around the solar cell 110 and laterally completely encloses the latter, which becomes better apparent from FIG. 2, described in even greater detail below. The region 160 between solar cell 110 and interposer 150 is filled with an encapsulation compound 165 (which can also be designated as a molding compound). The interposer 150 can be for example a printed circuit board (which among those skilled in the art is also known by the designation PCB). The interposer 150 contains metalized through contacts 170 for the electrical connection between metallic contact areas 175 at the underside (first surface 140) and top side (second surface 177) of the carrier unit 150. Said metallic contact areas 175 of the carrier unit 150 can be designated as a carrier contact connection since they enable contact to be made with the carrier unit 150 from the solar cell 110, and vice versa. Alternatively, the interposer 150 can also contain metal contacts (not illustrated in FIG. 1) at the outer edge (or at an edge situated opposite the solar cell 110), which are produced for example by the arrangement of the through contacts 170 in a sawing line. The solar cell 110 and possibly further components 120 and/or 125, which are applied on a back or contacting side 183 of the solar cell 110 and are contactable via a cell contact connection 185 (which is electrically insulated from the solar cell 110), are contacted among one another and/or to the interposer 150 by means of at least one electrical conductor 190 using a wire bonding method or using FC technologies (FC=Flip-Chip). In this case, the wire bonding contacts 190 drawn to the interposer 150 extend via the region filled by molding or encapsulation compound 165 between interposer 150 and PV cell 110. The exemplary embodiment illustrated in FIG. 1 shows the direct contacting of components 120 and/or 125 among one another and/or directly to the interposer ring 150 and contacting of an ASIC 125 as evaluation circuit. The PV cell back side (i.e. the contacting side) and the components 120 and/or 125 on said side and the interposer region 150 are (at least partly) covered by the molding compound, i.e. by the encapsulation compound 165.

Figure 2:
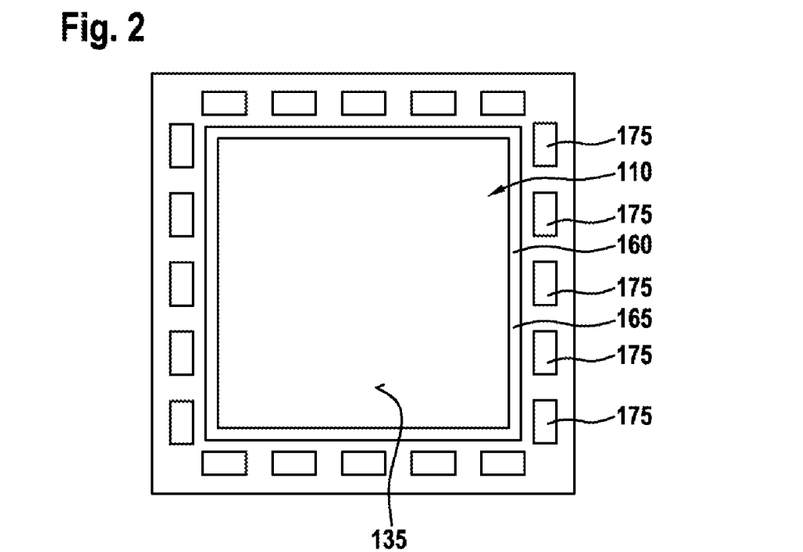
FIG. 2 shows a plan view illustration of the photovoltaic module in accordance with the exemplary embodiment of the present disclosure as illustrated in FIG. 1.

FIG. 2 shows a plan view illustration of the photovoltaic module in accordance with the exemplary embodiment of the present disclosure as illustrated in FIG. 1. FIG. 2 is in this case a view from below the exemplary embodiment of the present disclosure as shown in FIG. 1. The PV cell 110 is surrounded by the interposer 150 in a ring-shaped fashion. Metalized contact areas 175 are arranged at the underside 140 of the interposer 150 and can serve, inter alia, for making contact with the system or the photovoltaic module 100 by soldering. The region 160 between PV cell 110 and interposer ring 150 is filled by molding compound 165. An individual system of a photovoltaic module 100 is illustrated. However, in accordance with one particularly expedient exemplary embodiment, the disclosure can be implemented in the panel (for example of many individual systems in the array) and can be singulated by for example by sawing in the last process step after the molding or potting of the encapsulation compound 165.

To summarize, with regard to the first exemplary embodiment shown in FIGS. 1 and 2 it should be noted that currently only a few conceivable concepts are available for the simple, robust and primarily small-design integration of solar cells as energy converters into electronic systems such as sensor modules. Complex processes such as mold via technology, redistribution wirings by means of lithographic processes, embedding technology prove not yet to be mature and to be very cost-intensive. Moreover, the integration of solar cells is subject to particular challenges. In this regard, an opening or access to the solar-active side (i.e. the irradiation side) of the PV cell 110 is desirable. Moreover, edges of the solar cells 110 should be able to be protected and electrical conduction paths 175 and/or 190 should be able to be redistributed both laterally and vertically. A high potential, primarily with regard to low costs for the construction and connection technology, is manifested by construction concepts which are based to the greatest possible extent on standard processes such as are used worldwide, inter alia for the housings of electronic circuits.

One important aspect of the present disclosure can be considered that of providing a construction and contacting concept for a photovoltaic module 100 comprising solar cells 110 in electronic systems and providing a possibility for a method for producing the photovoltaic module 100, wherein this photovoltaic module 100 contains at least one redistribution region 150 (which can also be designated here as interposer or carrier unit) which contains contact areas 175 for electrical and/or mechanical contacting and furthermore at least one solar cell 110 which is connected in particular to at least one electronic component 120 and/or 125. The photovoltaic module 100 expediently comprises an interposer 150 or a carrier unit arranged at least on one side alongside the solar cell 110, wherein for example an underside 140 of the interposer 150 together with the solar-active side (irradiation side 135) of the PV cell 110 form a common lower termination, i.e. form a common housing surface of a housing 155 at expediently one height level.

In particular, the interposer 150 can extend in a ring-shaped fashion around the PV cell 110 and laterally enclose the latter. Moreover, the photovoltaic module 100 or the solar cell 110, the carrier unit 150 and the electrical conductor 190 can be at least partly covered by a molding compound 165. In this case, the molding compound 165 can extend at least over the non-solar-active 135 (irradiation side) of the PV cell 110, the at least one further component 120 and/or 125 and the interposer 150, wherein the molding compound 165 fills the region 160 between interposer 150 and solar cell 110 in such a way that a region that is planar to the greatest possible extent arises at the solar-active side 135 circumferentially around the PV cell 110. Moreover, the electrical contact areas 175 of the interposer 150 can be contacted at the top side 177 by means of standard contacting technologies appertaining to construction and connection technology, which proves to be particularly cost-effective. For this purpose, by way of example, the contact areas 175 can be contacted by means of a wire bonding method to metallization regions (i.e. the cell contact connections 185) on the PV cell back side 183 (contacting side) or of the at least one electronic component 120 and/or 125. Moreover, the interposer 150 can contain electrical through contacts 175 which electrically conductively connect the contact areas 175 at the top side 177 to the contact areas 175 at the underside 140 of the interposer 150.

The approach presented here by way of example makes it possible to realize some advantages. By way of example, it should be mentioned here that the PV cell 110 is introduced by means of standard technologies appertaining to construction and connection technology (i.e. standardized placement), which proves to be particularly cost-effective. Moreover, electrical contacts to the redistribution region 150 can be implemented by means of standard technologies appertaining to construction and connection technology (inter alia by means of wire bonding) and edge protection for the solar cell 110 can be realized technically in a very simple manner by molding compound 165. Moreover, it is possible to form through contacts 170 to the electrical contact areas 175 on the underside 140 of the system 100 by means of standard technologies appertaining to printed circuit board manufacture (plated-through hole production). At the same time a high reliability of the photovoltaic module 100 is ensured by known material interfaces. Moreover, it is possible to achieve a high design freedom owing, for example, to a redistribution wiring in the printed circuit board 150 and by means of known and cost-effective printed circuit board processes. Edge contacts or lands can be realized at the same time. Moreover, a standard process sequence appertaining to construction and connection technology can be carried out (e.g. placement, wire bonding, molding or the like). Furthermore, standard processes allow low costs and it is possible to use standard materials (for example PCB thermosetting plastic, copper, molding compound, silicon or the like). An interaction of the materials by means of temperature and ageing is also known, such that a lifetime of the photovoltaic module can be precisely set or estimated.

Figure 3:
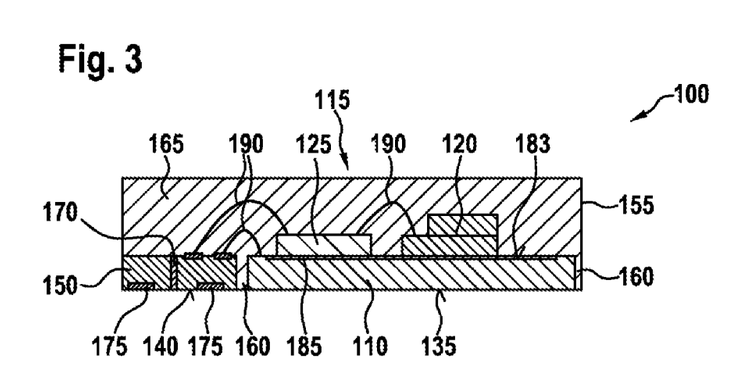
FIG. 3 shows a sectional illustration of a photovoltaic module in accordance with a further exemplary embodiment of the present disclosure.
Figure 4:
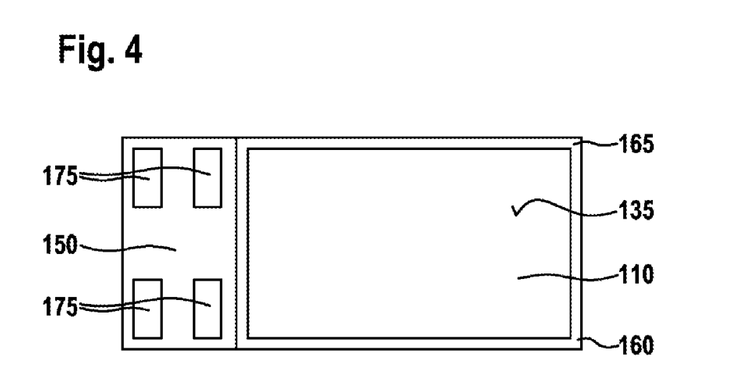
FIG. 4 shows a plan view illustration of the photovoltaic module in accordance with the exemplary embodiment of the present disclosure as illustrated in FIG. 3.

FIG. 3 shows a sectional illustration of a photovoltaic module in accordance with a further exemplary embodiment of the present disclosure. In this case the interposer 150 is arranged on one side alongside the PV cell 110. The region 160 between solar cell 110 and interposer 150 is filled with molding compound 165. In addition, the PV cell 110 is laterally completely surrounded with molding compound 165. FIG. 4 shows a plan view illustration (solar-active side) of the photovoltaic module in accordance with the exemplary embodiment of the present disclosure as illustrated in FIG. 3.

Figure 5A:
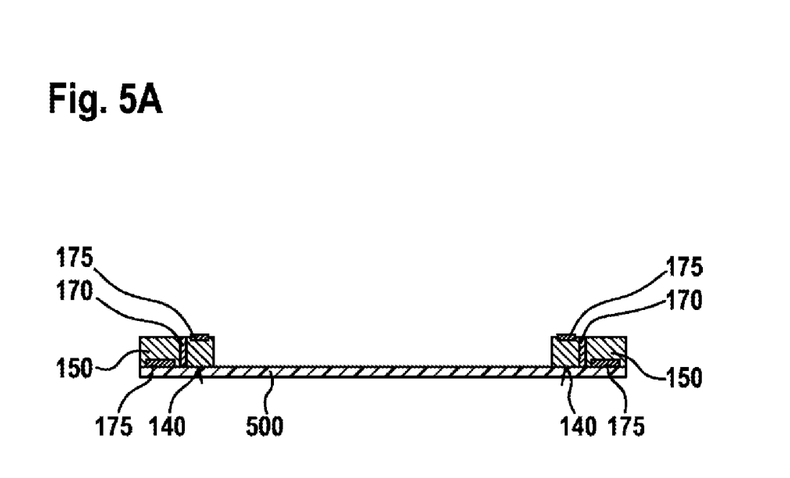
FIGS. 5A to E show sectional illustrations of different production stages of a photovoltaic module in accordance with one exemplary embodiment of the present disclosure.
Figure 5B:
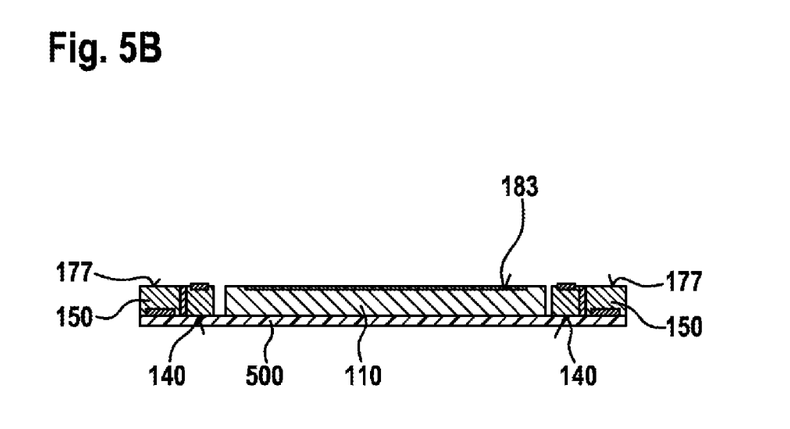
Figure 5C:
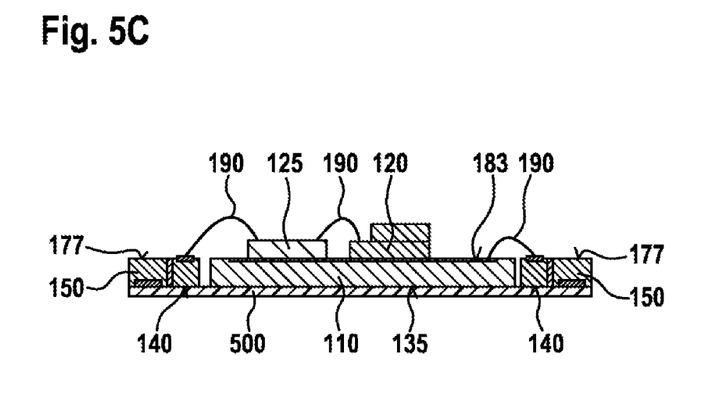

FIGS. 5A to E show sectional illustrations of different production stages of a photovoltaic module 100 in accordance with one exemplary embodiment of the present disclosure. The subfigures of FIG. 5 thus show a production method or a method for realizing the exemplary embodiment of the disclosure on the basis of the example of the photovoltaic module 100 described in FIG. 1. At the beginning of the process, as illustrated in FIG. 5A, the interposer 150 or an array arrangement of many interposers 150 are covered with a temporary carrier film 500 at the interposer underside 140 e.g. by lamination or adhesive bonding. Alternatively, a carrier film 500 already provided with redistribution regions 150 during production can be involved. The carrier film 500 spans the placement region of the PV cell 110. The PV cell 110 is applied to the carrier film 500 by e.g. adhesive bonding by means of a placement machine, such that a production stage of the photovoltaic module 100 as illustrated in FIG. 5B is attained. In the next process step, the production stage of which for the photovoltaic module 100 is illustrated in FIG. 5C, the components (e.g. Bare die Chips 120, 125, SMD housings, BGA, LGA, further printed circuit boards (PCB), further printed circuit boards with further placed chips etc.) are placed onto the PV cell backside 183 and, e.g. by adhesive bonding or soldering (the soldering contacts not being illustrated in FIG. 5C), are mechanically contacted or electrically contacted in the case of soldering under certain circumstances also using electrical conductors 190. Furthermore, the components 120 and the PV cell 110 can be electrically contacted among one another, to the interposer ring 150 and to the solar cell back side by wire bonding with electrical conductors 190. In this regard, it is also conceivable for a plurality of PV cells 110 to be arranged alongside one another on the carrier film 500 and to be interconnected in parallel or in series via wire bonds 190.

Figure 5D:
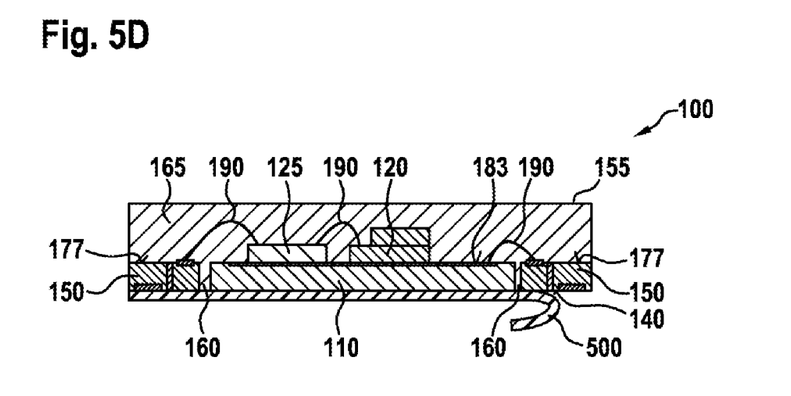
Figure 5E:
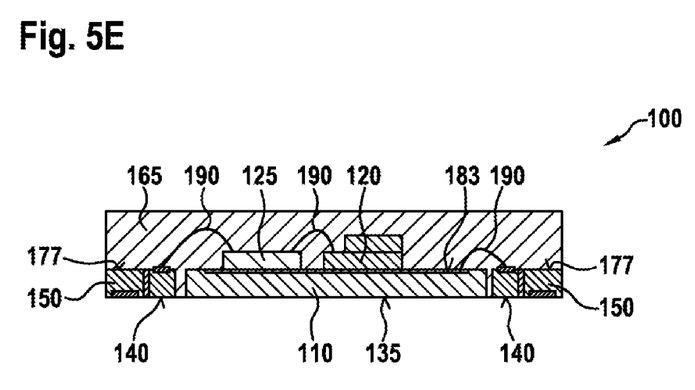

After a molding step in which the PV cell back side, the components 120 and/or 125 arranged on the back side, and also the back side 140 of the interposer 177 (second surface) are (at least partly) covered with a potting compound 165, the carrier film 500 is detached or stripped away. The result of this production step or the process of detecting the carrier film 500 is illustrated in FIG. 5D. This detachment can be carried out, inter alia, mechanically or by a thermal process step. Moreover, it is possible for specific regions to be kept free of potting compound 165, for example as media acess for pressure sensors. The photovoltaic module 100 produced in this way is illustrated (apart from the media access) in FIG. 5E.

Figure 6:
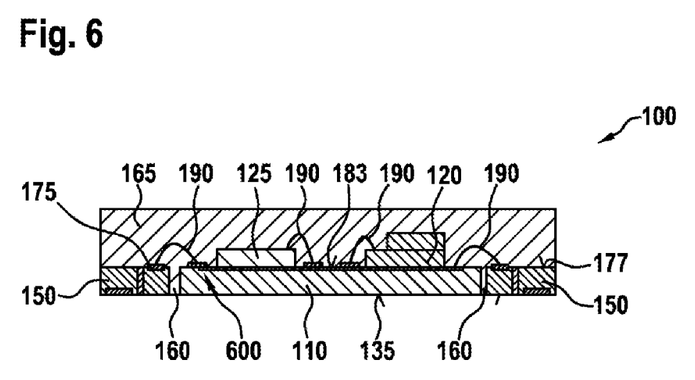
FIG. 6 shows a sectional illustration of a photovoltaic module in accordance with a further exemplary embodiment of the present disclosure.

As an alternative to directly contacting components 120 and/or 125 to the interposer ring 150, the PV cell back side 183 can also contain redistribution layers 600 that allow the electronic components 120 and/or 125 to be applied more flexibly in terms of the arrangement and to be contacted to the redistribution wiring or the carrier unit 150. Such an exemplary embodiment of a photovoltaic module of the present disclosure is represented as a sectional illustration in FIG. 6. Via a conductor track routing 600, the signals of the electronic components 10 and/or 125 are then led to a further contact area 185 positioned e.g. near the interposer 150 and are contacted to the interposer 150 via wire bonds 190. The redistribution wiring or the conductor tracks 600 for the redistribution wiring can be implemented e.g. by means of lithographic processes.

Figure 7A:
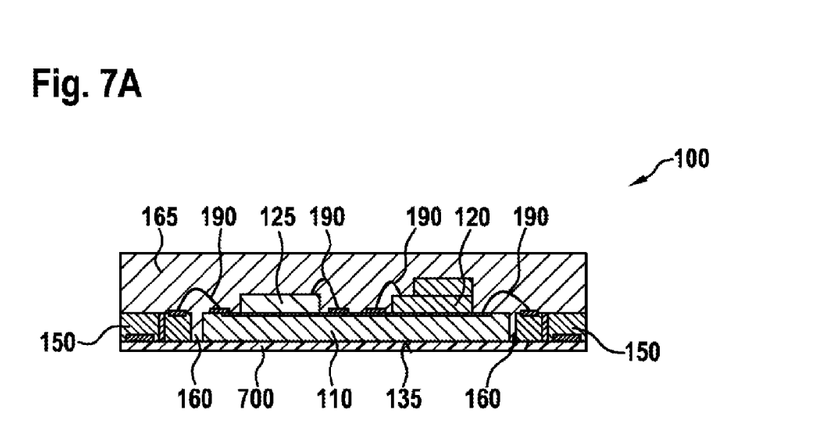
FIG. 7A shows a sectional illustration of a photovoltaic module in accordance with a further exemplary embodiment of the present disclosure.
Figure 7B:
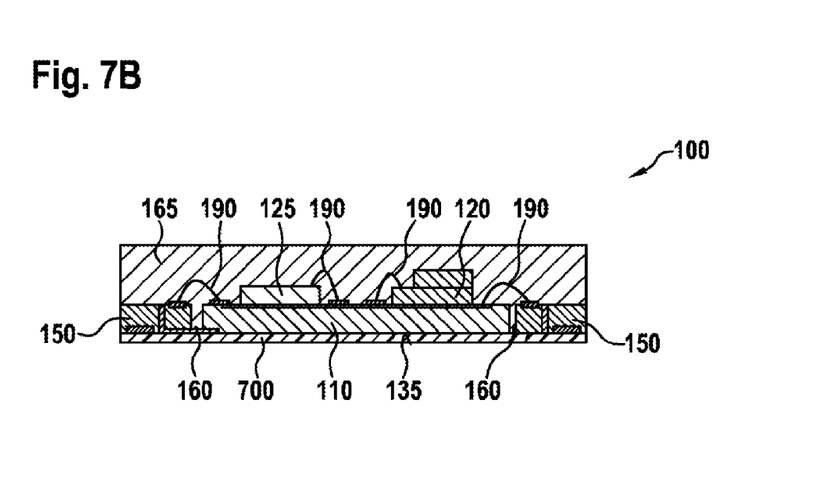
FIG. 7B shows a sectional illustration of a photovoltaic module in accordance with a further exemplary embodiment of the present disclosure.

FIG. 7 shows a sectional illustration of a photovoltaic module 100 in accordance with a further exemplary embodiment of the present disclosure. The Solar-active side 135 of the PV cell 110 can be protected by protective layers 700, protective films or protective lacquers. These can extend laterally as far as the interposer ring 150 or the underside 140 thereof and can be used for insulating metalized contact areas 175. In the region of the solar-active side 135 (irradiation side), the protective layer 700 is correspondingly embodied in an optically transparent fashion, as is illustrated in FIG. 7B. The protective layer 700 can also be the carrier film 500 in accordance with the description of the production method in the subfigures of FIG. 5. Furthermore, the redistribution layer 600 itself can contain a redistribution wiring in order to ensure, inter alia, an electrical contacting of the solar-active side 135 (front-side contacting) of the PV cell 110. With the use of a mechanically robust protective layer 700/protective film having load-bearing capability in the embodiment with an interposer ring 150, as an alternative to potting compound 165, a metal or plastic cover can be used which is mechanically fixedly connected to the interposer ring 150 and projects above and caps the region of the PV cell back side 183. If appropriate, through holes in the metal cover as media access are possible.

Figure 8:
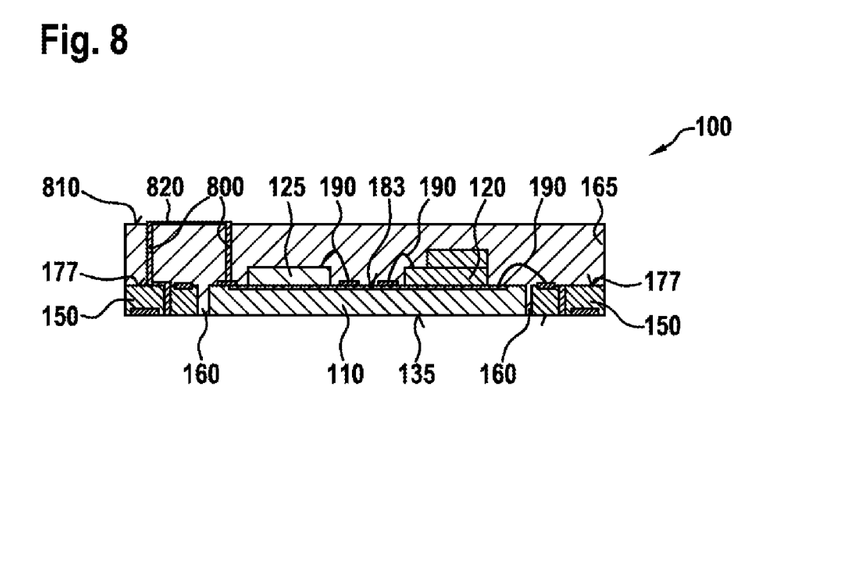
FIG. 8 shows a sectional illustration of a photovoltaic module in accordance with a further exemplary embodiment of the present disclosure.

FIG. 8 shows a sectional illustration of a photovoltaic module 100 in accordance with a further exemplary embodiment of the present disclosure as an alternative to the contacting of the interposer 150 to the PV cell back side 183 or component 120 and/or 125 arranged there, mold through contacts 800 can be implemented which span the region 160 between PV cell 110 and interposer 150 which is filled with mold molding compound 165. The connection of the mold through contacts 800 at a mold top side 810—situated opposite the solar cell 110 and/or the carrier unit 150—with the potting compound 165 via conductor tracks 820, with implementation of contact areas, can also be used for making contact with further systems (package to package).

Figure 9:
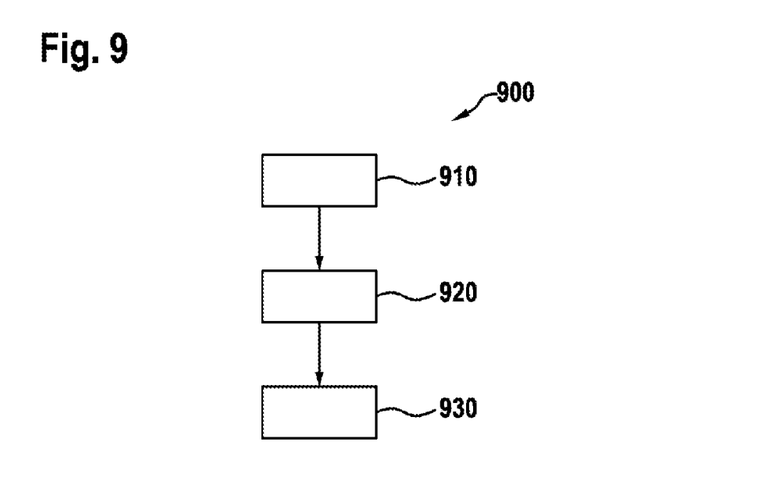
FIG. 9 shows a diagram of one exemplary embodiment of the present disclosure as a method for producing a photovoltaic module.

FIG. 9 shows a flow diagram of one exemplary embodiment of the present disclosure as method 900 for producing a photovoltaic module 100. The photovoltaic module comprises at least one solar cell having an irradiation main surface (135) for receiving light, intended for providing a voltage, wherein the photovoltaic module comprises a carrier unit, which is arranged in a manner laterally offset with respect to the photovoltaic module at least on a first side, wherein a first surface of the carrier unit is aligned flush with the irradiation surface of the solar cell within a predefined tolerance range. The photovoltaic module furthermore comprises at least one electrical conductor which makes electrically conductive contact between a carrier contact connection at a second surface of the carrier unit, said second surface being situated opposite the first surface and a cell contact connection of an electronic component on the solar cell or the solar cell, wherein the cell contact connection is arranged on a contacting side of the solar cell, said contacting side being situated opposite the irradiation surface. The method 900 comprises a step 910 of providing the carrier unit and the solar cell. Furthermore, the method 900 comprises a step 920 of arranging the solar cell in relation to the carrier unit in such a way that the carrier unit is arranged in a manner laterally offset with respect to the solar cell at least on a first side, and wherein the first surface of the carrier unit is aligned flush with the irradiation surface of the solar cell within the predefined tolerance range. Finally, the method 900 comprises a step 930 of electrically conductively connecting the cell contact connection to the carrier contact connection in order to produce the photovoltaic module.

The exemplary embodiments described and shown in the figures have been chosen merely by way of example. Different exemplary embodiments can be combined with one another completely or with regard to individual features. Moreover, an exemplary embodiment can be supplemented by features of a further exemplary embodiment.

Furthermore, method steps according to the disclosure can be carried out repeatedly and in a different order than that described.

If an exemplary embodiment comprises an "and/or" link between a first feature and a second feature, then this should be interpreted such that the exemplary embodiment has both the first feature and the second feature in accordance with one embodiment and has either only the first feature or only the second feature in accordance with a further embodiment.

The invention claimed is:

1. A photovoltaic module comprising:
   at least one solar cell having an irradiation surface configured to receive light, the at least one solar cell configured to provide a voltage;
   at least one carrier unit formed from a printed circuit board and defining an opening, the at least one carrier unit arranged laterally offset with respect to the at least one solar cell at least on a first side, and the at least one solar cell located within the opening such that a first surface of the at least one carrier unit is aligned flush with the irradiation surface of the at least one solar cell within a predefined tolerance range; and
   at least one electrical conductor configured to make electrically conductive contact between a carrier contact connection at a second surface of the at least one carrier unit, said second surface situated opposite the first surface, and (i) a cell contact connection of an electronic component on the at least one solar cell, or (ii) the at least one solar cell, wherein the cell contact connection is located on a contacting side of the at least one solar cell, said contacting side situated opposite the irradiation surface, and wherein the opening extends completely through the printed circuit board.

2. The photovoltaic module as claimed in claim 1, wherein the at least one carrier unit laterally surrounds the at least one solar cell on at least two sides.

3. The photovoltaic module as claimed in claim 1, further comprising an encapsulation compound which encloses at least the at least one electrical conductor and covers or caps the second surface of the at least one carrier unit and a contacting side of the at least one solar cell.

4. The photovoltaic module as claimed in claim 3, wherein the encapsulation compound is arranged in the opening and between the at least one solar cell and the at least one carrier unit, thereby separating the at least one solar cell from the at least one carrier unit, such that the at least one solar cell is prevented from contacting directly the at least one carrier unit.

5. The photovoltaic module as claimed in claim 4, wherein the encapsulation compound forms an encapsulation compound surface which is aligned flush with the irradiation surface and the first surface of the at least one carrier unit.

6. The photovoltaic module as claimed in claim 3, wherein the encapsulation compound forms a fluid-tight seal of a region between the second surface of the at least one carrier unit, the at least one electrical conductor and the contacting side.

7. The photovoltaic module as claimed in claim 3, wherein the encapsulation compound has at least one through contact enabling electrically conductive contact with at least one of the carrier contact connection and of the cell contact connection.

8. The photovoltaic module as claimed in claim 1, wherein the printed circuit board includes a plurality of conductor tracks configured to connect different electronic components.

9. The photovoltaic module as claimed in claim 1, wherein the at least one carrier unit has at least one through contact configured to make electrically conductive contact between the carrier contact connection on the second surface of the at least one carrier unit and at least one further contact connection on the first surface.

10. The photovoltaic module as claimed in claim 1, wherein:

the at least one solar cell further includes the electronic component, and the electronic component is configured to at least one of measure a physical quantity and process an electrical signal.

11. The photovoltaic module as claimed in claim 1, wherein:

the irradiation surface of the at least one solar cell is covered by a carrier film, or at least one of the first surface and the carrier contact connection is capped by the carrier film.

12. A method for producing a photovoltaic module, comprising:

forming an opening in at least one carrier unit formed from a printed circuit board;

forming the opening completely through the printed circuit board;

arranging at least one solar cell having an irradiation surface configured to receive light in the opening, such that the at least one carrier unit is laterally offset with respect to the at least one solar cell at least on a first side, and a first surface of the at least one carrier unit is aligned flush with the irradiation surface of the at least one solar cell within a predefined tolerance range; and electrically conductively connecting a cell contact connection to a carrier contact connection on a second surface of the at least one carrier unit to produce the photovoltaic module, the second surface situated opposite the first surface, and the cell contact connection arranged on a contacting side of the at least one solar cell, the contacting side situated opposite the irradiation surface, wherein the cell contact connection is either (i) of an electronic component on the at least one solar cell, or (ii) of the at least one solar cell.

13. The method of claim 12, wherein the method is carried out by a device configured to produce the photovoltaic module.

14. The photovoltaic module as claimed in claim 2, wherein the at least one carrier unit encloses the at least one solar cell in a ring-shaped fashion.

15. The photovoltaic module as claimed in claim 4, wherein the at least one solar cell is laterally completely surrounded by the encapsulation compound.

16. The photovoltaic module as claimed in claim 8, wherein at least one conductor track of the plurality of conductor tracks includes or forms the carrier contact connection.

17. The photovoltaic module as claimed in claim 10, wherein the electronic component is arranged at the contacting side of the at least one solar cell.

18. The photovoltaic module as claimed in claim 11, wherein the carrier film is transparent to optically visible light in a region of the irradiation surface.

* * * * *